(12) United States Patent
Van Kervinck et al.

(10) Patent No.: US 9,507,629 B2
(45) Date of Patent: *Nov. 29, 2016

(54) NETWORK ARCHITECTURE AND PROTOCOL FOR CLUSTER OF LITHOGRAPHY MACHINES

(71) Applicant: MAPPER LITHOGRAPHY IP B.V., Delft (NL)

(72) Inventors: Marcel Nicolaas Jacobus Van Kervinck, The Hague (NL); Guido De Boer, Leerdam (NL)

(73) Assignee: MAPPER LITHOGRAPHY IP B.V., Delft (NL)

( * ) Notice: Subject to any disclaimer, the term of this patent is extended or adjusted under 35 U.S.C. 154(b) by 0 days.

This patent is subject to a terminal disclaimer.

(21) Appl. No.: 14/738,962

(22) Filed: Jun. 15, 2015

(65) Prior Publication Data

US 2015/0309424 A1    Oct. 29, 2015

Related U.S. Application Data

(63) Continuation of application No. 13/452,990, filed on Apr. 23, 2012, now Pat. No. 9,086,912.

(60) Provisional application No. 61/533,673, filed on Sep. 12, 2011, provisional application No. 61/478,117, filed on Apr. 22, 2011.

(51) Int. Cl.
*G06F 9/46* (2006.01)
*G06F 19/00* (2011.01)
(Continued)

(52) U.S. Cl.
CPC ............... *G06F 9/48* (2013.01); *B82Y 10/00* (2013.01); *B82Y 40/00* (2013.01);
(Continued)

(58) Field of Classification Search
CPC .... G06F 9/48; G06F 9/4881; G03F 7/70483; G03F 7/70508; G03F 7/70525; G03F 7/70991; G05B 19/41865; H01J 37/3177; B82Y 10/00; B82Y 40/00
See application file for complete search history.

(56) References Cited

U.S. PATENT DOCUMENTS 5,243,377 A    9/1993   Umatate et al.
5,778,386 A *  7/1998   Lin .................. H01L 22/20
(Continued)

FOREIGN PATENT DOCUMENTS

CN    1648890 A    8/2005
CN    101718955 A  6/2010
JP    2011054679 A 3/2011

*Primary Examiner* — Camquy Truong
(74) *Attorney, Agent, or Firm* — Hoyng Monegier LLP; David P. Owen

(57) ABSTRACT

A lithography system having one or more lithography elements Each lithography element has a plurality of lithography subsystems. The lithography system further has a control network forming a control network path between the plurality of the lithography subsystems and at least one element control unit for communication of control information. The lithography system is arranged for: issuing control information to the at least one element control unit to control operation of one or more of the lithography subsystems for exposure of one or more wafers; issuing a process program to the element control unit. The process program has a set of predefined commands and associated parameters. The element control unit is arranged to transmit a command of the process program to a lithography subsystem to be executed by the lithography subsystem, regardless of an execution status of a preceding command transmitted to the lithography subsystem.

22 Claims, 10 Drawing Sheets

(51) Int. Cl.
   *G06F 9/48*      (2006.01)
   *G03F 7/20*      (2006.01)
   *H01J 37/317*    (2006.01)
   *B82Y 10/00*     (2011.01)
   *B82Y 40/00*     (2011.01)
   *G05B 19/418*    (2006.01)

(52) U.S. Cl.
   CPC ...... *G03F 7/70483* (2013.01); *G03F 7/70508* (2013.01); *G03F 7/70525* (2013.01); *G03F 7/70991* (2013.01); *H01J 37/3177* (2013.01); *G05B 19/41865* (2013.01); *G06F 9/4881* (2013.01)

(56) References Cited

U.S. PATENT DOCUMENTS

| | | | |
|---|---|---|---|
| 5,820,679 | A | 10/1998 | Yokoyama et al. |
| 6,011,952 | A | 1/2000 | Dankberg et al. |
| 6,092,098 | A * | 7/2000 | Araki ............... G06F 9/461 709/201 |
| 6,099,598 | A | 8/2000 | Yokoyama et al. |
| 6,714,830 | B2 * | 3/2004 | Browning ........ G05B 19/41865 700/100 |
| 6,897,458 | B2 | 5/2005 | Wieland et al. |
| 6,958,804 | B2 | 10/2005 | Wieland et al. |
| 7,019,908 | B2 | 3/2006 | van t Spijker |
| 7,084,414 | B2 | 8/2006 | Wieland et al. |
| 7,129,502 | B2 | 10/2006 | Kruit |
| 7,149,792 | B1 | 12/2006 | Hansen et al. |
| 7,603,194 | B2 | 10/2009 | Yokoyama et al. |
| 2001/0010950 | A1 | 8/2001 | Savage et al. |
| 2002/0033136 | A1 | 3/2002 | Savage et al. |
| 2002/0072001 | A1 | 6/2002 | Brown et al. |
| 2002/0120417 | A1 | 8/2002 | Naya et al. |
| 2003/0046034 | A1 | 3/2003 | Kitamoto et al. |
| 2003/0148198 | A1 | 8/2003 | Lakkapragada et al. |
| 2003/0188289 | A1 | 10/2003 | Koyama |
| 2003/0220754 | A1 | 11/2003 | Naya et al. |
| 2004/0005507 | A1 | 1/2004 | Lakkapragada et al. |
| 2004/0067627 | A1 | 4/2004 | Lee et al. |
| 2004/0107020 | A1 | 6/2004 | Yokoyama et al. |
| 2004/0125355 | A1 | 7/2004 | Naya et al. |
| 2004/0186609 | A1 | 9/2004 | Patel et al. |
| 2005/0085090 | A1 | 4/2005 | Mui et al. |
| 2005/0119843 | A1 | 6/2005 | Naya et al. |
| 2005/0270857 | A1 | 12/2005 | Naya et al. |
| 2005/0286097 | A1 | 12/2005 | Hung et al. |
| 2006/0102853 | A1 | 5/2006 | Heinitz et al. |
| 2006/0111802 | A1 | 5/2006 | Yokoyama et al. |
| 2006/0111805 | A1 | 5/2006 | Yokoyama et al. |
| 2006/0138366 | A1 | 6/2006 | Lakkapragada et al. |
| 2006/0155414 | A1 | 7/2006 | Naya et al. |
| 2007/0010905 | A1 | 1/2007 | Chou |
| 2007/0027569 | A1 | 2/2007 | Naya et al. |
| 2007/0064213 | A1 | 3/2007 | Jager et al. |
| 2007/0067725 | A1 | 3/2007 | Cahill et al. |
| 2007/0142950 | A1 | 6/2007 | Okita |
| 2007/0203873 | A1 * | 8/2007 | Jeunink ............... G03F 7/70508 |
| 2007/0219736 | A1 | 9/2007 | Okita |
| 2008/0049263 | A1 | 2/2008 | Nakamura et al. |
| 2008/0125903 | A1 | 5/2008 | Naya et al. |
| 2008/0183312 | A1 * | 7/2008 | Funk ............... G05B 19/41865 700/45 |
| 2008/0243293 | A1 | 10/2008 | Yokoyama et al. |
| 2008/0304940 | A1 | 12/2008 | Auer-Jongepier et al. |
| 2009/0079974 | A1 | 3/2009 | Lakkapragada et al. |
| 2009/0212229 | A1 | 8/2009 | Wieland et al. |
| 2009/0261267 | A1 | 10/2009 | Wieland et al. |
| 2010/0131093 | A1 | 5/2010 | Yokoyama et al. |
| 2010/0268913 | A1 | 10/2010 | Van Halder et al. |
| 2011/0004334 | A1 | 1/2011 | Kobayashi |
| 2011/0073782 | A1 | 3/2011 | Wieland et al. |
| 2011/0079730 | A1 | 4/2011 | Wieland |
| 2011/0216299 | A1 | 9/2011 | Steenbrink et al. |
| 2011/0264250 | A1 | 10/2011 | Nishimura et al. |
| 2011/0292356 | A1 | 12/2011 | Tsukinoki et al. |
| 2012/0091318 | A1 | 4/2012 | Wieland et al. |
| 2012/0091358 | A1 | 4/2012 | Wieland et al. |
| 2013/0273474 | A1 | 10/2013 | Wang et al. |

* cited by examiner

NETWORK ARCHITECTURE AND PROTOCOL FOR CLUSTER OF LITHOGRAPHY MACHINES

CROSS REFERENCE TO RELATED APPLICATIONS

This application is a continuation of U.S. application Ser. No. 13/452,990, now U.S. Pat. No. 9,086,912, filed on Apr. 23, 2012, which claims priority to U.S. provisional application No. 61/533,673 filed on Sep. 12, 2011, and U.S. provisional application No. 61/478,117 filed on Apr. 22, 2011. All these applications are hereby incorporated by reference in their entirety.

BACKGROUND OF THE INVENTION

1. Field of the Invention

The invention relates to a clustered substrate processing system comprising a plurality of lithography elements each arranged for independent exposure of substrates according to pattern data, and more particularly to network architecture and protocol for such a clustered substrate processing system.

2. Description of the Related Art

In the semiconductor industry, an ever increasing desire exists to manufacture structures with high accuracy and reliability. In lithography systems this desire results in extremely high demands with respect to the amount and the speed of production of wafers. Lithography machines have become more complex with numerous subsystems for performing various functions within the machine, and complex software to control the operation of the subsystems. Modern lithography machines typically generate large amounts of data operation and managing the data has become increasingly difficult. Lithography machines may be grouped together in a cluster of lithography elements to provide higher volume production. Transmission of information within such a cluster of lithography elements for control and data collection has become a problem as the amount of information to transmit increases and the complexity of the systems creases.

Network architectures exist which combine control and data services into a single network and use quality of service techniques to prioritize delivery of certain data to provide timely delivery of critical control data, but have proven to be insufficient in this environment. The present invention provides an alternative solution for a network architecture and protocol to provide timely delivery of critical control data and collection of large amounts of data for a cluster of lithography elements.

BRIEF SUMMARY OF THE INVENTION

It is desirable to cluster a plurality of lithographic machines wherein control and data services are accommodated in the cluster network architecture and protocol. In one aspect the invention provides a clustered substrate processing system comprising one or more lithography elements, each lithography element arranged for independent exposure of substrates according to pattern data. Each lithography element comprises a plurality of lithography subsystems, a control network arranged for communication of control information between the lithography subsystems and at least one element control unit, the element control unit arranged to transmit commands to the lithography subsystems and the lithography subsystems arranged to transmit responses to the element control unit. Each lithography element also comprises a cluster front-end for interface to an operator or host system, the front-end arranged for issuing control information to the at least one element control unit to control operation of the one or more lithography subsystems for exposure of one or more wafers. The front-end is arranged for issuing a process program to the element control unit, the process program comprising a set of predefined commands and associated parameters, each command corresponding to a predefined action or sequence of actions to be performed by one or more of the lithography subsystems, and the parameters further defining how the action or sequence of actions are to be performed.

The element control unit may be arranged for scheduling the process program to generate a corresponding process job for execution by the lithography subsystems, the process job comprising the set of commands of the process program and a scheduled execution time for each of the commands. The process job may be entirely scheduled before execution of the process job begins. This results in a known and fixed time period for execution of the complete process job before it begins. The scheduled start time (and completion time) for each step and of the complete process may be reported to the cluster front-end. This greatly simplifies scheduling of activities within the fab, such as when substrates should be delivered to the lithography element and when exposure of a substrate in the lithography element is expected to be completed which facilitates scheduling the track system which transfers substrates to and from the lithography element.

The element control unit may be arranged for generating the process job comprising the set of commands of the process program and, for each of the commands, an identity of a lithography subsystem scheduled to execute the command. The element control unit may be arranged to execute the process job by transmitting each of the commands of the process job to the identified lithography subsystem at the scheduled execution time for each of the commands. The element control unit may be arranged to transmit each of the commands of the process job to the identified lithography subsystem at the scheduled execution time for each of the commands regardless of an execution status of a preceding command of the process job. The execution time of the commands of the process job are not conditional upon the results of a preceding or parallel step, but are executed according to the predetermined time schedule. If a step does not complete correctly or within the scheduled time, it will not be executed again, but instead the next scheduled step will be executed.

The process program may define a predetermined time period for a corresponding command, and the element control unit may be arranged for scheduling the process program to generate a process job for execution by the lithography subsystems, the process job comprising a scheduled execution time for each command, the predetermined time period being used to determine the scheduled time for the corresponding command in the process job.

The process program may define a first predetermined time period for a corresponding first command, and the element control unit may be arranged to delay initiating a next command following the first command until expiration of the time period and regardless of an execution status of the first command. The scheduled timing of execution of commands of the process job is not dependent upon feedback from the subsystems regarding successful completion or even failure to execute a command from a preceding step. If a subsystem reports that execution of a command has completed, the element control unit is arranged to wait until the scheduled execution time for the next command before executing the next command. If a subsystem reports a failure or error in executing a command, the element control unit waits until the scheduled execution time for the next command and will then proceed with executing the next command. Any timing variation in execution of a command of the process program is accounted for in the scheduling of the process job, so that the scheduled time for execution of a command is greater than the greatest expected execution time. The time schedule is typically defined in the process job.

The element control unit may be arranged to initiate an action or sequence of actions by one of the lithography subsystems by sending the one or more parameters for the action or actions to the subsystem via the control network, and subsequently sending the command corresponding to the action or actions to the subsystem. The element control unit may be arranged to send the one or more parameters to the subsystem in advance of a scheduled time for execution of the command by a time period, the time period being sufficient to ensure that the subsystem has received the one or more parameters before the command is sent to the subsystem. The one or more parameters maybe transmitted in one or more messages so that any one message is limited in size. The parameters may comprise a significant amount of data, so the larger messages containing the one or more parameters are sent in advance when timing of transmission to the subsystems is not critical. A much smaller message containing only the command (without associated parameters) can be sent at the time scheduled for execution of the command. This measure distributes load on the network and avoids congestion when the command is sent, to reduce transmission time and increase timely and reliable transmission of the command.

Upon completion of an action or sequence of actions corresponding to a command issued by the element control unit, the lithography subsystem which completed the action or sequence of actions may be arranged for notifying the element control unit of the completion and, upon receiving an instruction from the element control unit, to issue data relating to execution of the action or sequence of actions. When the element control unit receives the notification from the subsystem of completion of the action or sequence of actions, the element control unit may send a request to the subsystem to transmit the data relating to execution of the action or sequence of actions. This distributes load on the network and avoids congestion when the completion notification is sent, to reduce transmission time and increase timely and reliable transmission, and the data can then be retrieved later when timing is not critical.

The process program may be programmed to include no conditional steps. The process program may include conditional steps programmed as alternative commands, the alternative commands being scheduled in parallel in the process job, each assigned the same execution time so that the execution time of the process job as a whole does not vary depending on which alternative command is selected for execution.

The lithography subsystems may be arranged to transmit an acknowledgment to the element control unit to acknowledge receipt of a command from the element control unit. The acknowledgment may be used by the element control unit to detect when a subsystem has stopped responding as expected. The acknowledgement may be configured to carry no other information than a confirmation that the subsystem received the relevant command and is still functioning, the identity of the subsystem sending the acknowledgment, and a time stamp. The subsystems may be arranged with no timeouts for executing a command for a process job. A timeout in the element control subsystem may be set at a time period much longer than an expected response time for an acknowledgement from the subsystems. This timeout is large enough to conclude beyond reasonable doubt that a subsystem is not functioning, but is small enough to detect a failure before an operator would normally do so.

Modification of software in a subsystem to update or upgrade the software is performed by executing a process job in the element control unit. This modification may include modifying the basic operating system software of the subsystem or any application or utility software of the subsystem. This enables one single interface method for both lithography operations and service actions such as update or upgrade of subsystem software.

The control network may be arranged to provide quasi real-time performance without using a real-time communication protocol.

Each lithography element may further comprise a data network arranged for communication of data logging information from the lithography subsystems to at least one data network hub, the lithography subsystems arranged to transmit data logging information to the data network hub and the data hub arranged for receiving and storing the data logging information, and wherein the front-end is further arranged for receiving at least a portion of the data logging information received by the data network hub. This network architecture separates control and data functions into separate networks. The control functions require bi-directional data flow, and require predictable information transfer through the control network. The data collection and management functions generally require uni-directional flow, from the lithography subsystems upwards in the data network to the data network hub and onwards to the cluster interface, and can involve very large quantities of data. The lithography subsystems may be arranged to transmit data to the data network at a first transmission rate and the data network hub arranged to receive data from the data network at a second transmission rate, wherein the second transmission rate is much greater than the first transmission rate.

The control network may use a byte transmission protocol on a TCP link. The element control unit and the lithography subsystems may be arranged to transmit message sequences on the control network, and wherein a first message of a message sequence comprises two elements, the first element containing a string with a message type and the second element containing a dictionary with named arguments for the message. The first message of the message sequence may contain a control data structure encoded in JavaScript Object Notation (JSON). A second message of the message sequence may comprise one or more encoded data messages, wherein the encoding of the data messages is not set or limited by the control network protocol. This scheme of mixing arbitrary messages with control messages allows process job commands and outputs to be produced directly in a data format that is understandable by the operator, and permits transmission of such messages without additional encoding.

The control network may also include a controller arranged to ensure that multiple data transfers do not take place simultaneously on the control network.

BRIEF DESCRIPTION OF THE DRAWINGS

Embodiments of the invention will now be described, by way of example only, with reference to the accompanying schematic drawings in which.

DESCRIPTION OF ILLUSTRATIVE EMBODIMENTS

The following describes certain embodiments of the invention, given by way of example only and with reference to the figures.

Figure 1:
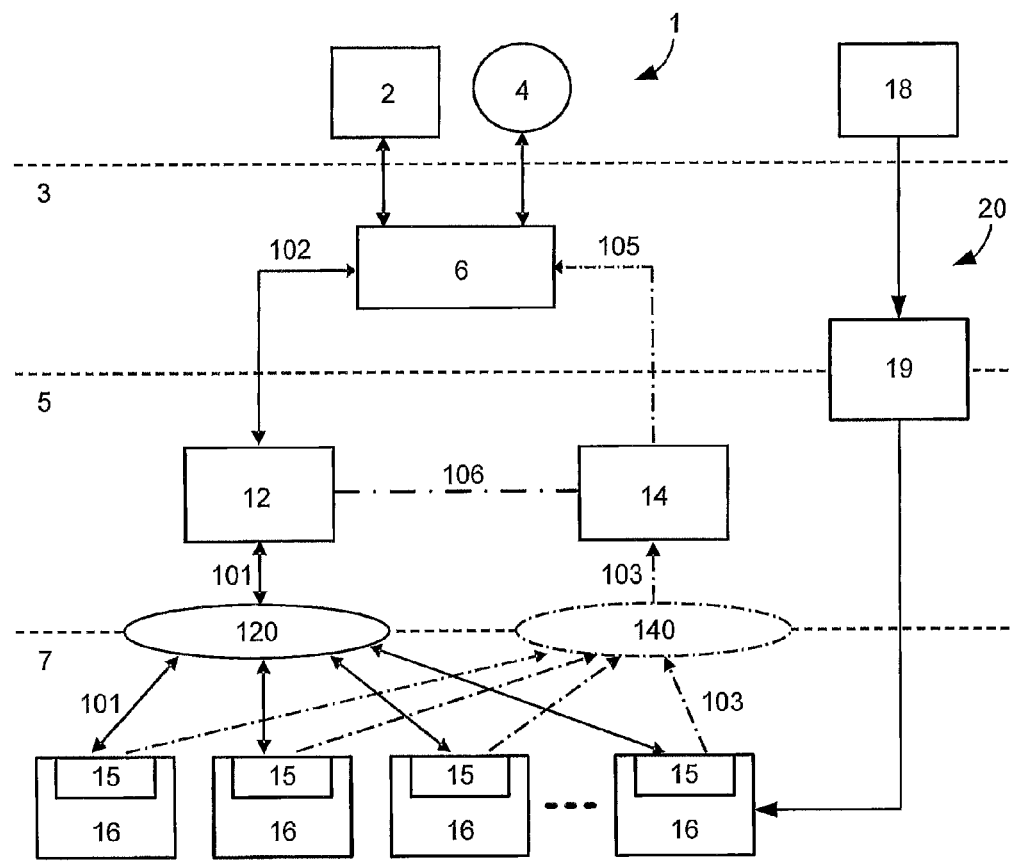
FIG. 1 is a schematic diagram of an embodiment of a network architecture for a lithography system according to the invention.

FIG. 1 is a schematic diagram of one embodiment of a lithography system 1 with control and data interfaces according to the invention. The diagram shows a hierarchical arrangement with three interfaces, a cluster interface 3, cluster element interface 5, and the lithography subsystem interfaces 7. FIG. 1 one illustrates a configuration with a lithography system cluster comprising one lithography element 10, which comprises multiple lithography subsystems 16. The lithography system may comprise multiple lithography elements 10, e.g. as in the FIG. 2 embodiment.

The cluster interface 3 comprises interfaces for communication between a lithography cluster front-end 6 and one or more host systems 2, and/or between the cluster front-end 6 and one or more operator consoles 4.

The cluster element interface 5 comprises interfaces for communication between the cluster front-end 6 and a lithography element network comprising a element control unit 12 and/or a data network hub 14. The element control unit 12 may be in communication with a data network hub 14 via link 106, wherein the communication is preferably unidirectional from the element control unit 12 to the data network hub 14.

The lithography subsystem interface 7 comprises interfaces between the element control unit 12 and the lithography subsystems 16, and between the data network hub 14 and the lithography subsystems 16. The subsystems 16 communicate with the element control unit 12 via control network 120, and the subsystems 16 communicate with the data network hub 14 via data network 140.

Figure 2:
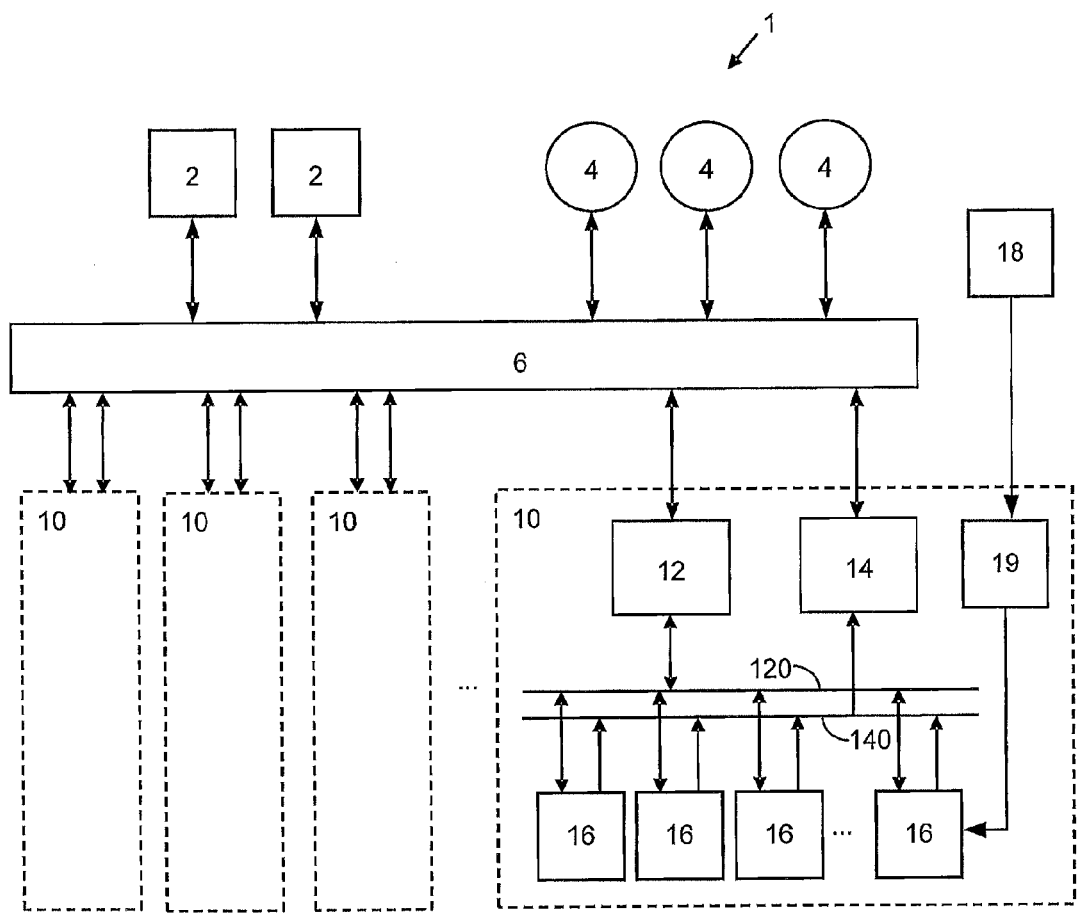
FIG. 2 is a schematic diagram of an embodiment of a network architecture for a lithography system comprising a cluster of lithography elements.

FIG. 2 is a schematic diagram of an embodiment of a lithography system 1 in which the lithography system cluster comprises multiple lithography elements 10, each element comprising multiple lithography subsystems 16. Each element may comprise a element control unit 12 and data network hub 14 communicating with the lithography subsystems 16 for the element. Each element may function as a stand-alone lithography element which is able to operate independently to expose wafers using a lithography process. In this embodiment, the multiple lithography elements 10 each communicate with a single front-end 6, and the front-end 6 communicates with one or more host systems 2 and/or operator interfaces 4 which function for the entire cluster.

The embodiments in FIGS. 1 and 2 are preferably designed to facilitate efficient control of a cluster of lithography elements. Each lithography element 10 preferably only has network interfaces, to the control network 120 and data network 140. An exception to this design rule is the data path 20 directly connecting the pattern streamer 19 to the subsystem(s) responsible for modulating or switching the charged particle beams. The pattern data is initially prepared in the pattern data processing system 18 and sent to pattern streamer 19 for data conversion and streaming to the subsystems. This design is due to the extremely high volume of pattern data transferred to the relevant subsystem(s). The pattern data is typically streamed to the relevant subsystems in a bit-map format, since the quantity of data is too great for local storage at the subsystem.

The operator interfaces and interfaces to higher-level host supervisory and automation computers are made not with the individual lithography elements but at the cluster front-end 6. This enables such interfaces to be developed for the cluster without requiring knowledge of the interface protocol to the lithography elements 10 and without placing additional demands and interfering with communication across the control network 120 and data network 140.

Figure 3:
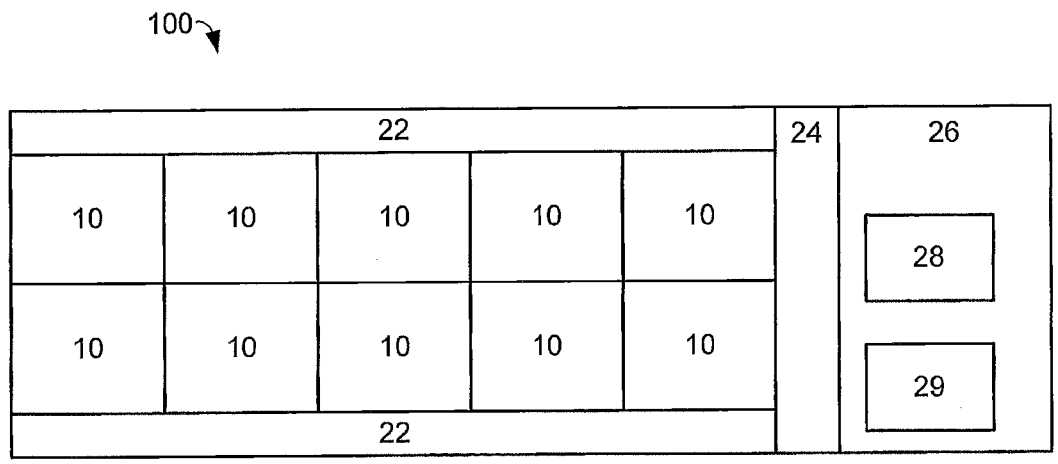
FIG. 3 is a diagram of a layout of a cluster of lithography elements.

FIG. 3 shows a simplified top view of a lithography system cluster 1. In this embodiment, the cluster comprises a group of ten lithography elements 10, arranged back-to-back in two rows of five. Directly adjacent to the cluster 1, floor space is reserved as service area 23. Each lithography element comprises an electron-optical column contained in its own vacuum chamber, with one side of each vacuum chamber facing a substrate delivery system 22 and service area 23. The substrate delivery system 22 receives substrates from a substrate supply system 24 and supplies them to the lithography elements 10 for processing, and receives processed substrates from the lithography elements 10 and supplies them to the substrate supply system 24 for transfer to other systems in the fab.

In case of a charged particle lithography apparatus, the vacuum chamber preferably encloses the charged particle source and components for generating multiple charged particle beamlets, a beam modulation system switching or modulating the beamlets, a projector system for projecting the beamlets onto a substrate to be patterned, and a moveable substrate stage. The vacuum chamber preferably includes a load lock system for transferring substrates into and out of the vacuum chamber from the substrate delivery system 22, and also an access door facing the service area 23 that can be opened for service access to the electron-optical column.

Each lithography element 10 operates independently to receive and process wafers. Each lithography element includes its own computer processing systems for processing data and operating the components and subsystems of the lithography element. Each lithography subsystem 16 preferably has its own computer processor and memory system, to execute commands to direct the operations of the subsystem, collect data resulting from operation of the subsystem, and communicate with the control and data networks. The control element unit 12 and data network hub 14 preferably each comprise their own computer processor and memory system for performing their functions. The computer processor and memory systems for the control element unit 12, data network hub 14, and subsystems 16 for a lithography element 10 may be located in close proximity to the vacuum chamber for the lithography element, e.g. in a cabinet mounted above the vacuum chamber, of in a basement below the vacuum chamber, or part in each location.

The back-to-back layout of the lithography elements of the cluster provides a system with a limited footprint, and placement of the computer processor and memory systems directly above or below the vacuum chambers also reduces the footprint. Floor space within a fab is valuable, and efficient use of the fab floor space is thus important.

Figure 4:
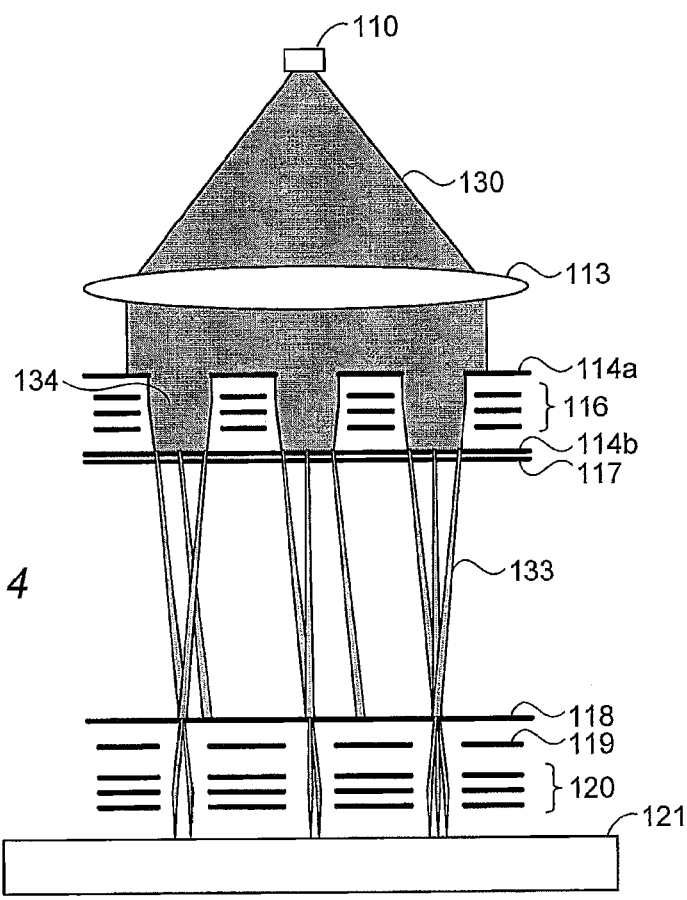
FIG. 4 is a simplified diagram of an electron-optical column of a charged particle lithography element.

FIG. 4 shows a simplified schematic diagram of an electron-optical column of a charged particle lithography element. Such lithography systems are described for example in U.S. Pat. Nos. 6,897,458; 6,958,804; 7,019,908; 7,084,414; and 7,129,502, U.S. patent publication no. 2007/0064213, and co-pending U.S. patent application Nos. 61/031,573; 61/031,594; 61/045,243; 61/055,839; 61/058,596; and 61/101,682, which are all assigned to the owner of the present invention and are all hereby incorporated by reference in their entireties.

In the embodiment shown in FIG. 4, the lithography element column comprises an electron source 110 producing an expanding electron beam 130, which is collimated by collimator lens system 113. The collimated electron beam impinges on an aperture array 114a, which blocks part of the beam to create a plurality of sub-beams 134, which pass through a condenser lens array 116 which focuses the sub-beams. The sub-beams impinge on a second aperture array 114b which creates a plurality of beamlets 133 from each sub-beam 134. The system generates a very large number of beamlets 133, preferably about 10,000 to 1,000,000 beamlets.

A beamlet blanker array 117, comprising a plurality of blanking electrodes, deflects selected ones of the beamlets. The undeflected beamlets arrive at beam stop array 118 and pass through a corresponding aperture, while the deflected beamlets miss the corresponding aperture and are stopped by the beam stop array. Thus, the beamlet blaker array 117 and beam stop 118 operate together to switch the individual beamlets on and off. The undeflected beamlets pass through the beam stop array 119, and through a beam deflector array 119 which deflects the beamlets to scan the beamlets across the surface of target or substrate 121. Next, the beamlets pass through projection lens arrays 120 and are projected onto substrate 121 which is positioned on a moveable stage for carrying the substrate. For lithography applications, the substrate usually comprises a wafer provided with a charged-particle sensitive layer or resist layer.

The lithography element column operates in a vacuum environment. A vacuum is desired to remove particles which may be ionized by the charged particle beams and become attracted to the source, may dissociate and be deposited onto the machine components, and may disperse the charged particle beams. A vacuum of at least $10^{-6}$ bar is typically required. In order to maintain the vacuum environment, the charged particle lithography system is located in a vacuum chamber. All of the major elements of the lithography element are preferably housed in a common vacuum chamber, including the charged particle source, projector system for projecting the beamlets onto the substrate, and the moveable stage.

Subsystems

In the embodiments of FIGS. 1 and 2, each lithography element 10 forms an independently operating lithography element for exposing wafers. Each lithography element 10 comprises multiple subsystems 16 which operate to perform the functions required for the element. Each subsystem performs a specific function. Typical subsystems 16 include, for example, a wafer load subsystem (WLS), wafer positioning subsystem (WPS), an illumination optics subsystem (ILO) for generating electron beamlets, a pattern streaming subsystem (PSS) for streaming beam switching data to the lithography element, a beam switching subsystem (BSS) for switching the electron beamlets on and off, a projection optics subsystem (POS) for projecting beamlets onto the wafer, a beam measurement subsystem (BMS), a metrology subsystem (MES) etc. Each lithography element 10 is preferably configured for receiving wafers, clamping each wafer to a chuck and preparing the clamped wafer for exposure, exposing the clamped wafer, and unclamping the exposed wafer from the chuck and presenting the exposed wafer for removal from the element.

Each subsystem 16 may comprise one or more modules 17 which are dedicated to a particular sub-functions and are preferably designed as replaceable components. The modules 17 may comprise actuators 19 and sensors 21, actuators 19 which are able to perform a command and sensors 21 which are able to detect actions and results and take measurements during, before and/or after performing a command. Examples of such modules include the stage for movement of the substrate during exposure, the control computer for control of the stage, the projection lens module supplying voltages to lens arrays for projecting the beamlets onto the substrate, a vacuum pump for generating a vacuum in the vacuum chamber, etc.

Each subsystem 16 operates independently and includes a memory for storing instructions and a computer processor for executing the instructions. The memory and processor may be implemented in each subsystem as a plug-in client (PIC) 15. A suitable implementation of a subsystem may include, for example, a personal computer running the Linux operating system. The subsystems may include a hard disk or non-volatile memory for storing their operating system so that each subsystems boots from this disk or memory. These and other features discussed below enable a design where each subsystem is an autonomous unit which can be designed, built and tested as an independent unit without needing to consider constraints imposed by other subsystems. For example, each subsystem may be designed with sufficient memory and processing capacity to properly perform the functions of the subsystem during its operating cycle, without needing to take into account the demands on memory and processing capacity made by the other subsystems. This is particularly advantageous during development and upgrade of the system, when these requirements are in flux. Disadvantages of this design are that the total required memory and processing capacity is increased, and redundancy of these components must be implemented within each subsystem. However, these disadvantages are outweighed by the simplified design leading to faster development and simpler upgrade.

The subsystems 16 are designed to receive commands via the control network 120 and execute the commands independently from the other subsystems, reporting results for the command execution and transferring any resulting execution data upon request.

The subsystems 16 may be designed as autonomous units, but designed to boot from a central disk or memory, for example on the data network hub. This reduces the reliability problem and cost of individual hard disks or non-volatile memory in each subsystem, and permits more easy software upgrade of a subsystem by updating the boot image for the subsystem in the central location.

Communication Protocols

The subsystems 16 are connected via a control network to a element control unit 12, also referred to as a Support Subsystem Control or SUSC. The element control unit 12 comprises memory and a computer processor for controlling operation of the subsystems for the lithography element 10.

Communication 102 between the cluster front-end 6 and SUSC 12 is designed for transfer of PPs to the SUSC 12. A protocol based on JavaScript Object Notation (JSON) may be used. JSON is a text-based open standard designed for human-readable data interchange, used for representing simple data structures and arrays, and is suitable for serializing and transmitting structured data over a network connection. Access to the protocol is preferably restricted to users at the cluster, and not to users outside the clean-room environment. The protocol preferably provides an instruction for creation of PJs, transferring the PP file and any associated parameters, to instruct the SUSC 12 to create a PJ based on the PP. Additional commands may include Abort and Cancel instructions. Communication from the SUSC 12 to the cluster front-end 6 may include acknowledgment messages, progress reporting, and error and alarm messages.

Figure 5:
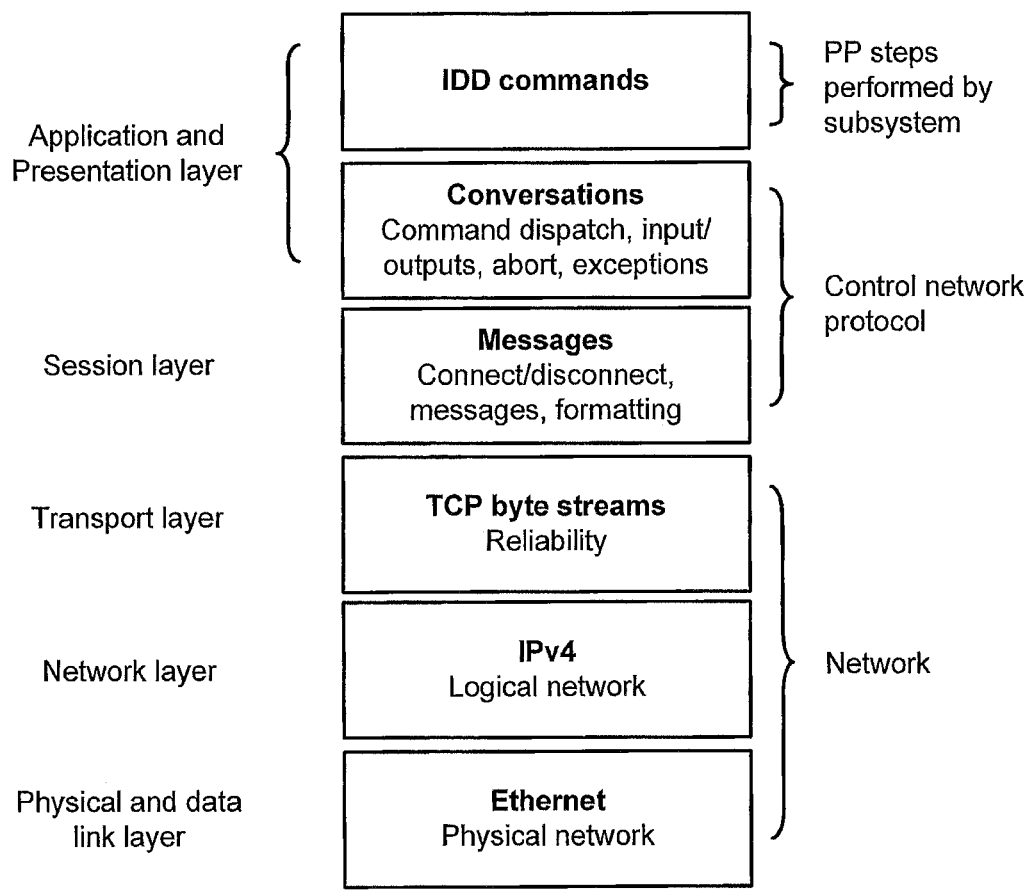
FIG. 5 is a schematic diagram of a element control unit protocol in an OSI layered model for a lithography tool according to an embodiment of the invention.

Communication 101 between the SUSC 12 and lithography subsystems 16 across control network 120 is preferably strictly controlled using only the element control unit protocol to ensure a quasi real-time performance in the network. FIG. 5 shows one embodiment of a element control unit protocol in an OSI (Open System Interconnection) layered model. The element control unit protocol is described in further detail below.

Communication 105 between SUSD 14 and cluster front-end 6 is designed for retrieval of PJ results, job tracing and data logging from the SUSD 14. A Hyper-Text Transfer Protocol (HTTP) may be used for this communication link.

Communication 103 between the lithography subsystems 16 and SUSD 14 is designed for one-way collection of data from the subsystems 16. The data may be communicated using a variety of protocols, such as syslog, HDF5, UDP and others.

High volume data may be sent using a User Datagram Protocol (UDP) to send data without the large overhead of handshaking, error checking and correction. Due to the resulting very low transmission overhead, the data can thus be regarded as being received in real-time.

The hierarchical data format HDF5 may be used for transmission and storage of the high-frequency data. HDF5 is well suited to storing and organizing large amounts of numerical data, but is usually not used in a UDP environment. Other data formats such as CSV or TCP can also be used, particularly for low level (low volume) data.

Process Program

The operation of the lithography element 10 is controlled using a process program (PP) 11, which comprises a sequence of actions to be performed. The element control unit 12 is loaded with a PP, and schedules and executes the PP 11 as requested by a host system 2 or an operator though an operator console 4. The PP 11 may take the role of a recipe, e.g. as defined in the SEMI E40 standard. Although the SEMI standards specify many requirements on how to deal with recipes, the standards may be contradictory so that recipes are preferably avoided. Instead, editable and unformatted PP are used in the form of so-called Binary Large Objects (BLOBs).

The PP as the pre-planned and reusable portion of the set of instructions, settings and parameters that determines the processing environment of the wafer and that may be subject to change between runs or processing cycles. PPs may be designed by the lithography tool designers or generated by tooling.

PPs may be uploaded to the lithography system by the user. PPs are used to create Process Jobs (PJs). A Process Job (PJ) specifies the processing to be applied to a wafer or set of wafers by a lithography element 10. A PJ defines which PP to use when processing a specified set of wafers and may include parameters from the PP (and optionally from the user). A PJ is a system activity started by a user or host system.

PPs may be used not only for controlling the processing of wafers, but also for service actions, calibration functions, lithography element testing, modifying element settings, updating and upgrading software, etc. Preferably no subsystem behavior occurs other than what is prescribed in a PP, with the exception of certain allowed additional categories, such as automatic initialization during power-up of a module or subsystem, periodic and unconditional behavior of a subsystem, as far as those don't influence PJ execution, and the response to an unexpected power-off, emergency or EMO activation.

A PP is divided into steps. Most steps comprise a command and identify a subsystem which is to perform the command. The step may also include parameters to be used in performing the command, and parameter constraints. The PP may also include scheduling parameters to indicate when a step is to be performed, e.g. to be performed in parallel, in sequence, or synchronized.

To execute a command step of the PJ, the element control unit 12 sends the command indicated in the PJ to the subsystem indicated in the relevant step of the PJ. The element control unit 12 monitors timing and receives the results from the subsystem. Examples of execution of specific commands are illustrated in FIGS. 6-13 and described below.

Plug-in Commands Concept

The element control unit (SUSC) 12 converts a PP (which represents a logical plan) into a schedule of subsystem actions. The system may be designed so that the SUSC 12 does not have a-priori knowledge of which subsystems 16 are installed, and which subsystem commands exist and what their properties are. In this case, this information is provided to SUSC 12 at runtime by the subsystems 16 during startup.

Each subsystem 16 may be designed to report their presence and capabilities to SUSC 12 when the subsystem is powered up and initialized. The subsystem establishes communication over the control network 120 and reports to SUSC 12 its identity and status, and may also report its capabilities such as which commands it is capable of performing. The SUSC 12 may perform a check before or during execution of a PP 11 that each subsystem required for the PP has reported its presence and a ready status, and may also check that each subsystem has reported its capability to perform the commands required for the subsystem in the PP.

This self-reporting by the subsystems enables the lithography system to be extended or upgraded with new functionality using only localized software upgrades to the subsystems, or even with no software upgrade at all. For example, a certain subsystem 16 may have its software upgraded so that it can execute a new command. The SUSC 12 may now be loaded with a new PP 11 which includes the new command for the upgraded subsystem. When the upgraded subsystem 16 is powered up it communicates with the element control unit 12, indicating its identity and status, and which commands it can execute, including the new command. The SUSC 12 schedules the PP to generate a PJ including the step commanding the subsystem to execute the new command. The SUSC 12 may perform a check that the upgraded subsystem has reported it is able to perform the new command. This upgrade thus only requires an upgrade of the relevant subsystem and of the PP, but not of SUSC 12 or any of the other subsystems 16.

Control Network

The control network 120 preferably does not use a real-time communication protocol, but nevertheless is designed to provide quasi real-time performance, providing for communication between the subsystems and SUSC 12 having high repeatability, e.g. a repeatability substantially within 1 millisecond, to provide for execution of the same job under same conditions resulting in the same timing behaviour.

This quasi real-time performance across the control network 120 may be achieved by implementing some or all of the following measures.

(a) The lithography system schedules each PP to generate a PJ prior to starting execution of the PJ, determining the time for starting (and may also include time for completing) each step of the PJ. The scheduled start time (and completion time) for each step and of the complete PJ may be completely determined before the PJ is initiated, and these times may be reported to the cluster front-end.

(b) The PP (and PJ) may be designed with no conditional steps or actions, and no retries. The steps of the PP/PJ describe a sequence of actions, although actions within a lithography element may be performed in parallel, e.g. commands executing in parallel on different subsystems. A conditional step or action may be programmed in a PP by defining two (or more) alternative steps to perform, where the alternatives steps are arranged as parallel paths. The alternative steps are scheduled in the PJ as parallel paths each assigned the same execution time, so that the execution time of the PJ as a whole does not vary depending on which alternative path is selected for execution on the subsystems.

The execution time of the steps of the PJ are not conditional upon the results of a preceding or parallel step, but are executed according to the predetermined schedule. If a step does not complete correctly or within the scheduled time, it will not be executed again (i.e. there are no retries), but instead the next scheduled step will be executed.

(c) After scheduling, every step will be executed by the SUSC 12 at its pre-determined scheduled time, preferably within a timing accuracy of about 1 millisecond. At the scheduled time, the SUSC 12 will execute the relevant step and send any command for that step to the relevant subsystem 16 for execution by the subsystem. The scheduled timing in SUSC 12 is not dependent upon feedback from the subsystems 16 regarding successful completion or even failure to execute a command from a preceding step. Where a step defines an execution time period, the SUSC 12 waits for that time period to elapse before proceeding to the next step of the PJ. If a subsystem returns a result from execution of a command before expiration of this period, the SUSC 12 will still wait for expiration of the time period before proceeding to the next step. If a subsystem fails to returns an error message, the SUSC 12 will nevertheless wait for expiration of the time period and will then proceed to the next step. The operator or host system will determine what corrective action may be necessary if a subsystem fails to properly execute a command.

Any timing variation in execution of a step is accounted for in the scheduling, so that the scheduled time for execution of a step is greater than the greatest expected execution time. The time schedule is typically defined in the PP. The scheduling moment may be "just-in-time" before execution starts, or some time before execution, e.g. when adding the step to an execution queue.

(d) The commands sent and executed by the subsystems 16 specify execution of the command with a fixed maximum time. The greatest execution time is the pre-determined maximum period as determined by a subsystem given it's circumstances. The operator or host system will determine what corrective action may be necessary if this time is exceeded.

(e) When executing a PJ step which has a command for a subsystem to perform and data associated with the command to be sent to the relevant subsystem, the data may be transmitted to the subsystem in advance of the command itself being sent to the subsystem. The data is transmitted in one or more messages so that any one message is limited in size. The data is sent sufficiently in advance to ensure that it has been received by the subsystem, i.e. the time between sending the data and sending the command is much larger than the expected transmission time, and the subsystem may acknowledge receipt of the data. This enables the larger messages containing the data to be sent in advance when timing is not critical, and a much smaller message containing only the command (without associated data) can be sent at the scheduled time. This measure distributes load on the network and avoids congestion when the command is sent, to reduce transmission time and increase timely and reliable transmission of the command.

(f) Similarly, when a subsystem completes execution of a command, it may send a short message to SUSC 12 indicating that the command has completed, but holds any data resulting from execution of the command for retrieval by SUSC 12 at a later time. When SUSC 12 receives the indication of command completion, it can then send a request to the subsystem to retrieve the resulting data. This distributes load on the network and avoids congestion when the command completion indication is sent, to reduce transmission time and increase timely and reliable transmission, and the data can then be retrieved later when timing is not critical.

(g) The message interchange between the subsystems 16 and SUSC 12 include reply messages to acknowledge receipt of instructions from SUSC 12. The reply messages carry no other information other than a confirmation that the subsystem 16 has received the relevant message from SUSC 12 and is still functioning. This enables the SUSC 12 to detect when a subsystem 16 has stopped responding as expected, so that this can be reported to the cluster front-end in a timely manner. To keep the software implementation simple, there are no timeouts for a subsystem 16. The total response time expected for reply messages is typically short, e.g. less than 0.5 ms round trip. To detect a non-responsive subsystem 16, SUSC 12 has a timeout that far exceeds the expected response time, e.g. 30 seconds after a response is expected. This timeout is large enough to conclude beyond reasonable doubt that a subsystem 16 is not functioning, but is small enough to detect a failure before an operator 4 would normally do so, so that the operator 4 does not have to wonder what is going on.

(h) The control network 120 includes a protocol controller secure a single transfer of a data package, e.g. a single message sequence, at a time.

(i) The control network uses a simple transmission protocol, e.g. byte protocol on TCP link. Transmission protocols which are complex or which include unpredictable elements are avoided. The protocol used on the control network ensures that multiple data transfers can not take place simultaneously, so that unpredictable events on the network do not occur.

A TCP connection consists of two byte streams, one in each direction. The protocol splits both of these streams up into discrete messages, each message a sequence of 0 or more bytes of arbitrary data, preceded by 4 bytes indicating the length of the sequence. This length may be encoded as an unsigned integer, e.g. a 32-bit integer in network order ("big-endian"), providing a maximum message size of (2^32−1) bytes. This message separation mechanism may be implemented by "Connection Objects" in the Python programming language. By using the standard multiprocessing connection package, Python itself can handle this part of the protocol. In other programming environments it would be necessary to implement this aspect explicitly. Messages can be initiated by either side provided these follow the prescribed sequences.

Every first message of a message sequence may contain a control data structure encoded in JavaScript Object Notation (JSON). All of the SUSC protocol JSON messages may have the same general structure: an array of 2 elements, the first containing a string with the message type and the second a dictionary with the named arguments for that message, e.g. ["<messageType>", {"param1": <value1>, "param2": <value2>, . . . }]

In some message sequences, e.g. those used to transfer input and output items of interface commands, this control/command message is immediately followed by several data messages, e.g. one data message per input/output item. The protocol makes no assumptions about the encoding used in these messages, the interpretation instead being described in a design document specifying subsystem commands, data and behavior, e.g. "list of tuples of 2 floats, encoded with pickle", or "pressure curve plot as image/pgn").

This scheme of mixing arbitrary messages with JSON control messages allows process job outputs to be produced by plug-in software directly in a data format that is understandable by the operator, such CSV, PDF, PNG. It also means that the transmission of such objects can be done without additional encoding or escaping as part of the data stream, for example by using Linux's sendfile function. This freedom can also be used to specifically agree between subsystems on an encoding that is more appropriate for the specific interface function. However, it would be unwise if every subsystem has its own data encoding scheme, so if a subsystem has no specific requirements a default scheme should be chosen to implement the best trade-off among the requirements.

(j) The subsystems are is not responsible for verifying correct behavior of SUSC 12 and detect SUSC protocol errors, to simplify the PIC 15 design. The purpose of the SUSC protocol is to execute process steps from process programs in process jobs created by the user. Exceptions are used to communicate unexpected behavior to the user. Besides errors in command execution of course also errors could occur by not complying with the SUSC protocol. The SUSC 12 is responsible to log exceptions and may close the connection to a PIC when the PIC is not behaving according to the SUSc protocol (or has stopped responding altogether), but that a PIC is not responsible for verifying the correct behavior of SUSC to keep the PIC requirements simple. If a protocol violation is encountered by a PIC, it might or might not respond gracefully to it and there is no requirement that subsequent messages must be understood. It is recommended to attempt to log some diagnostics, log an exception, disconnect and reconnect when a message can't be handled. This is a recommendation, not a requirement, as there can be no guarantee or expectation that after such reconnect the PIC is in again in an usable state (but at least it would be in a more or less understandable state).

(k) The interfaces for the operators and higher-level automation or supervisory fab computer systems are removed from the communications on the control network 120. These interfaces are provided from the cluster front-end 6, so that they do not generate congestion on the control network 120 and do not influence timing of communications with the subsystems 16.

(l) Data collection is completely separated in a separate data network 140 from the control communications on the control network 120. This separation of functions is discussed in more detail below.

Sync Clock

The lithography system provides a clock signal on the control network to enable synchronization of actions within the system and by the subsystems. The system may provide two clock signals at different frequencies to provide clocks to the subsystems for different timing accuracies, e.g. one clock signal accurate in milliseconds and one in nanoseconds. For example, the pattern streaming subsystem for streaming beam switching data and the beam switching subsystem for switching the electron beamlets on and off need to exchange data at very high frequency to enable high frequency switching of the beamlets, and the beam measurement subsystem is required to send beam position measurements at very high frequency. Other functions that need a high precision clock include the substrate positioning system and projection optics system. These subsystems are fed by and capable of receiving nanosecond clock pulses provided by a sync clock subsystem.

Control Network Protocol Messages

FIGS. 6A to 6H show message sequences 30, 40, 50, 70, 80, 90, 100 supported by a protocol. The sequence diagrams 30, 40, 50, 70, 80, 90, 100 are annotated with required response times for the average case and for time-outs that SUSC 12 will use before closing a connection. The described timings are in principle round trip times involving a SUSC 12, a SUSD 14 and a subsystem 16.

Figure 6A:
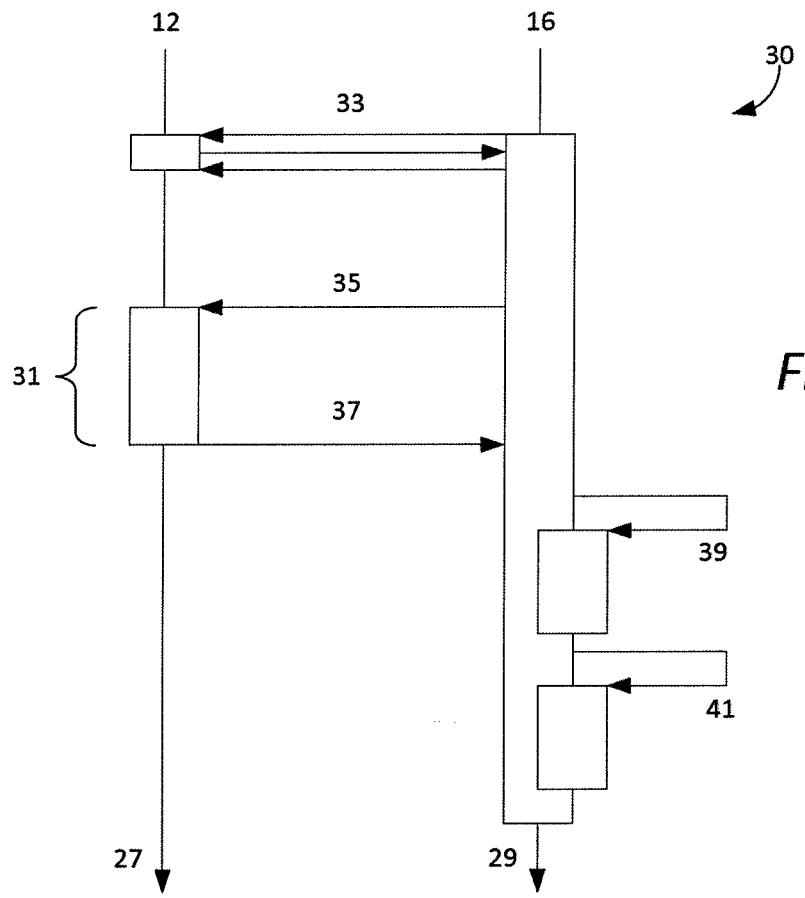
FIG. 6A is a schematic diagram of a connect sequence according to an embodiment of the invention.

The SUSC 12 protocol communicates messages over a TCP connection. SUSC 12 acts as the TCP server, and the PICs 15 in the subsystems 16 act as TCP clients. The PICs make a connection to SUSC 12 on a specific port, and the SUSC 12 has an IP address in the control network 120. If connecting fails PIC retries until it succeeds. FIG. 6A shows a connect sequence 30 where a element control unit (SUSC) 12 and a PIC in a subsystem 16 connect to each other. Vertical time lines 27, 29 are shown from SUSC 12 and subsystem 16 to indicate timing of messages. At some point in time the connect sequence begins with a standard 3-way handshake of the TCP protocol or TCP connection 33 to set up the connection at the operating system level. If the TCP connection 33 is established, the subsystem 16 sends a connect message 35 to SUSC 12. SUSC 12 sends a connect reply 37 within a time period 31, preferably 0.5 seconds. The connect reply 37 may contain location specific information, e.g. the time zone where the machine in located. This may be used to set the time zone 39 of SUSC 12. The subsystem 16 may do further internal subsystem initialization 41 afterwards.

In principle a connection is kept open indefinitely, i.e. until one of the sides shuts down and the connection is closed. This closing occurs either by an explicit socket close by the application or automatically by the operating system as part of its shutdown sequence. When a PIC 15 detects the closing of its connection it attempts to reconnect, and if reconnecting fails it may retry until it succeeds. When SUSC 12 detects the closing of a connection it may discard all information of the associated PIC (such as registered commands or planned future commands) and consider the PIC 15 and associated subsystem 16 absent until it reconnects.

In the special case that SUSC 12 hasn't detected the closing of the connection and a duplicate connection is established by a PIC 15, SUSC 12 may consider the previous connection closed. This scenario could happen when the PIC 15 was powered off suddenly without its kernel being given an opportunity to close TCP connections and the SUSC 12 hasn't attempted communication with this PIC yet.

Figure 6B:
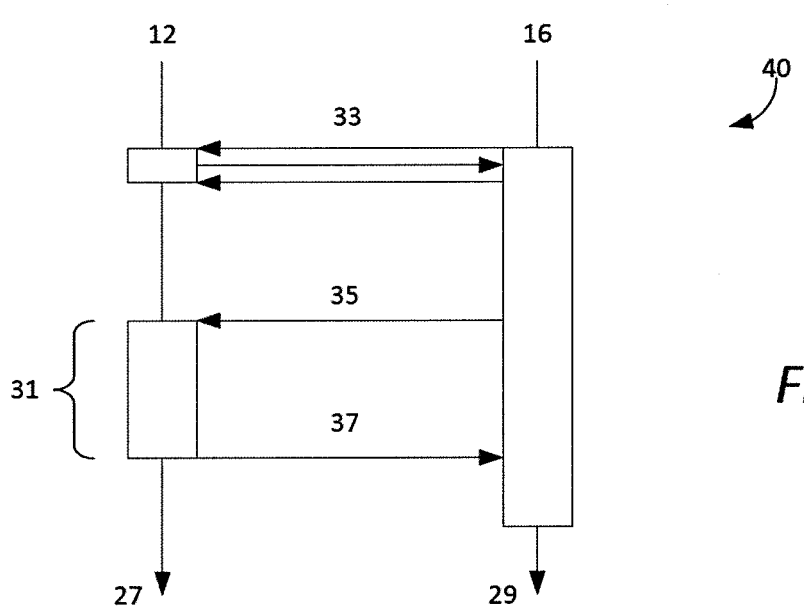
FIG. 6B is a schematic diagram of a reconnect sequence according to an embodiment of the invention.

This behavior ensures that either side can be restarted without requiring a restart of the other. FIG. 6B shows a reconnect sequence 40 which is started when a subsystem 16 has already been initialized, but has lost its connection to SUSC 12. It is the responsibility of the subsystem 16 to reconnect to SUSC 12. A repeat will be done by the subsystem 16 sending a connect message 35 to SUSC 12, and upon receiving the connect message 35, SUSC 12 sends a connect reply 37 message back to the subsystem 16. Here, also, within a time period 31, preferably 0.5 seconds. The reconnect sequence 40 will be repeated until the subsystem 16 is connected to SUSC 12.

Figure 6C:
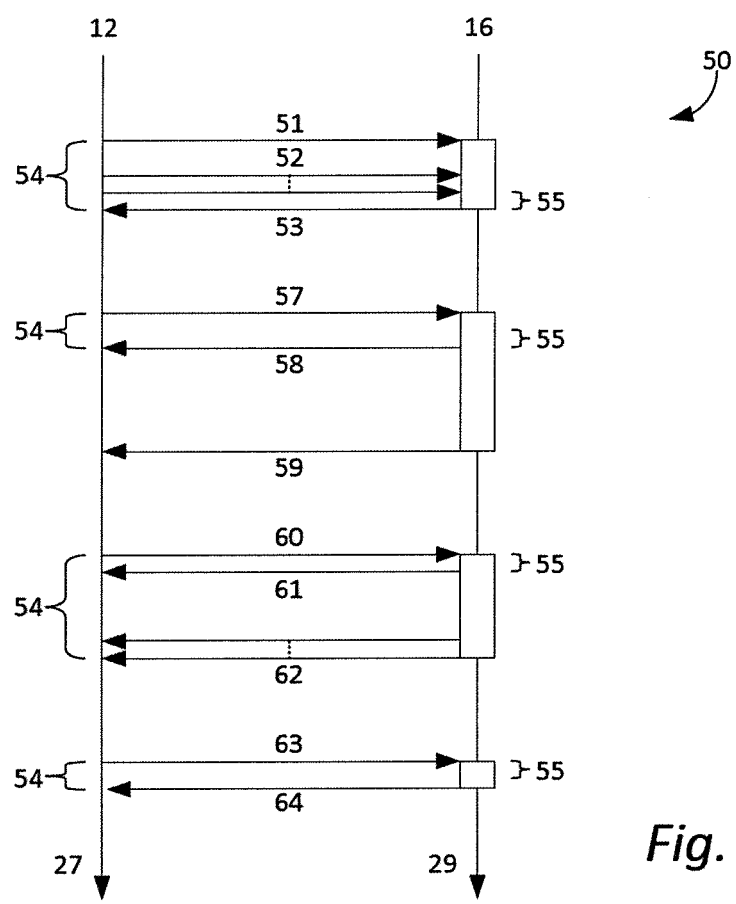
FIG. 6C is a schematic diagram of a execute command sequence according to an embodiment of the invention.

FIG. 6C shows an execute command sequence 50 which starts optionally with the transfer of input arguments with a 'set' command 51 to subsystem 16 by SUSC 12. The set command 51 is followed by N times an amount of data 52 sent to subsystem 16. After the final data 52 is sent, subsystem 16 acknowledges the received command 51 and data 52 by sending a set reply 53 (setReply) back to SUSC 12. Any reply sent from the subsystem 16 to SUSC 12, has a reply time period 55, which comprises preferably less than an average of 0.5 milliseconds. The set reply 53 must be sent within a time-out limit 54, which comprises preferably 30.0 seconds plus minus 1.0 seconds. If a reply is not received, SUSC 12 will consider subsystem 16 to be either not connected or defective. After SUSC 12 sends an execute command 57, subsystem 16 acknowledges preferably within the reply time period 55 with an executeStarted reply 58. After subsystem 16 has finished execution, it sends an executeDone 59 to SUSC 12. The output arguments (if any) are retrieved with the 'get' command 60 sent by SUSC 12. Subsystem 16 acknowledges with a getReply 61 and thereafter sends an N amount of data 62 or output arguments.

Input and output arguments that are no longer needed for future execute commands 57 are removed from subsystem 16 using the delete command 63. The subsystem 16 will preferably reply within the reply time period 55 with a deleteReply 64. In one version of the protocol inputs and outputs are not carried over from one interface command to the other. The subsystem 16 can safely assume no more inputs will be sent than needed for the next command, and it can safely assume that all inputs and outputs will be deleted before inputs of the next commands are sent.

Figure 6D:
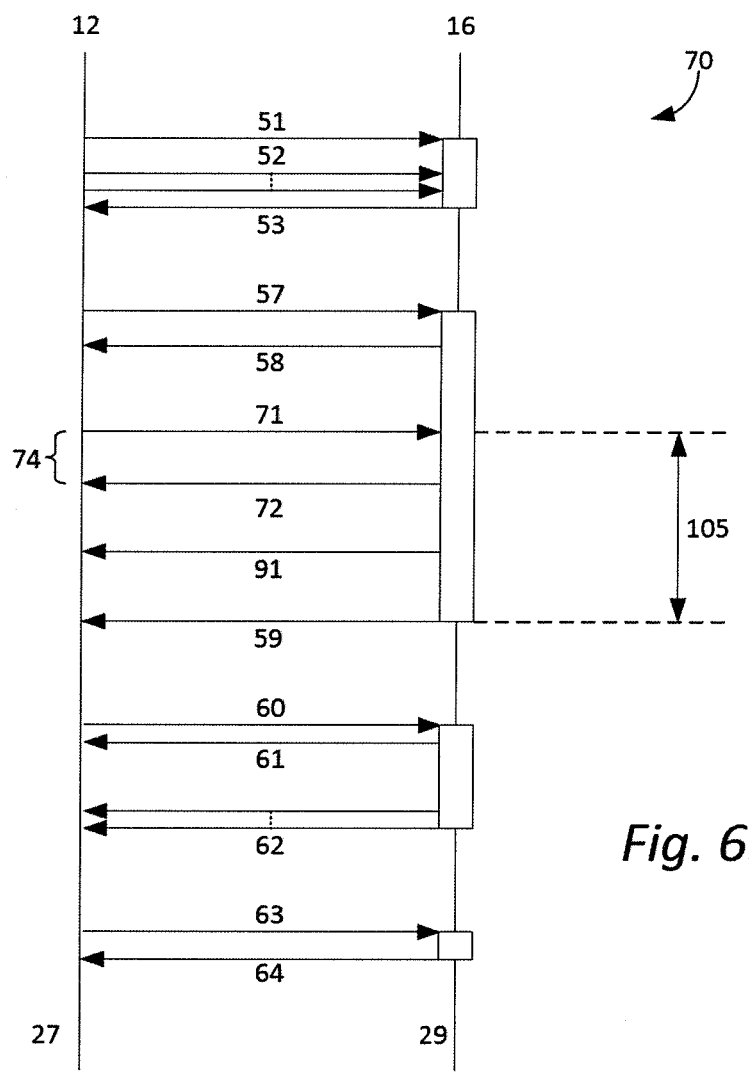
FIG. 6D is a schematic diagram of an abort sequence according to an embodiment of the invention.

FIG. 6D shows an abort sequence 70 which illustrates the order of events in the case of an aborted execute command 71. The abort sequence 70 is globally the same as a normal execute sequence 50 with the following differences. SUSC 12 sends an abort request 71 in the period between receiving the executeStarted 58 and executeDone 59 messages. The subsystem 16 in turn sends an abortReply 72. Sending an abortReply 72 to SUSC 12, as a response to the abort request 71, must be done within a time period abortReply 74, which comprises of 90.0 seconds plus or minus 1.0 second, where the 90 seconds comprise 60 seconds for the maximum polling interval plus an additional 30 seconds. Depending on the command currently executing, the command runs to completion or breaks off before the command is finished. If the command was not finished, an exception 91 may be logged. Also, not all output arguments may be available and empty ones (0 byte) may be substituted by the subsystem 16. The SUSC 12 will try to retrieve them all. It is possible that the abort message 71 from SUSC 12 and the executeDone 59 from the subsystem 16 cross each other. In that case the sequence 80 shown in FIG. 6E is applicable.

Figure 6E:
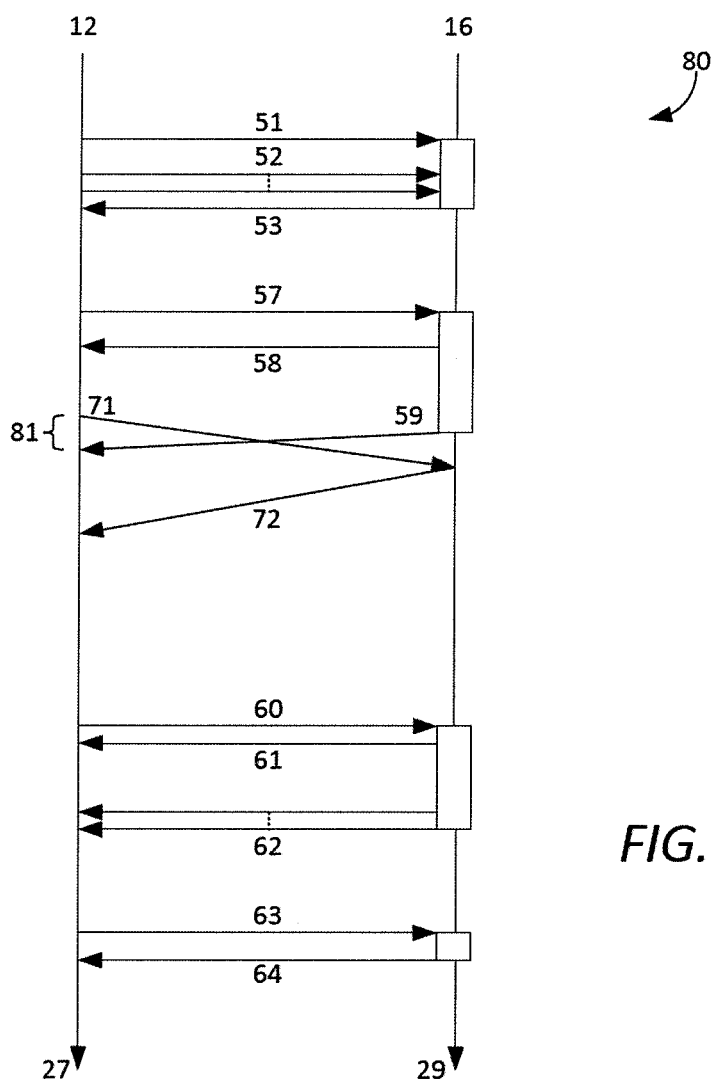
FIG. 6E is a schematic diagram of an abort sequence with race condition according to an embodiment of the invention.

FIG. 6E shows an abort sequence with a race condition 80. A race condition 81 is a condition which occurs when two or more messages cross each other. Here, the abort message 71 crosses with the executeDone message 59.

Figure 6F:
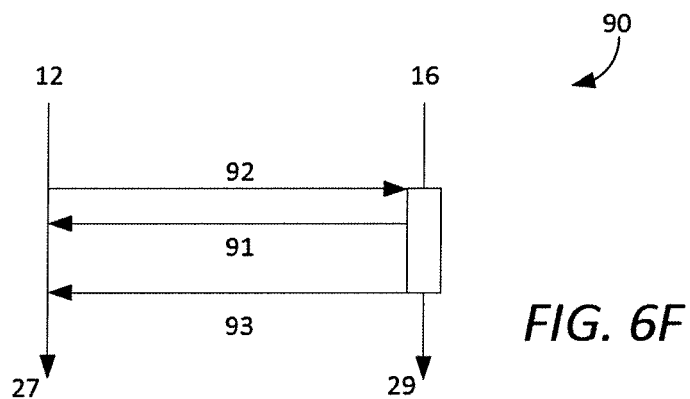
FIG. 6F is a schematic diagram of an exception sequence during generic command according to an embodiment of the invention.
Figure 6G:
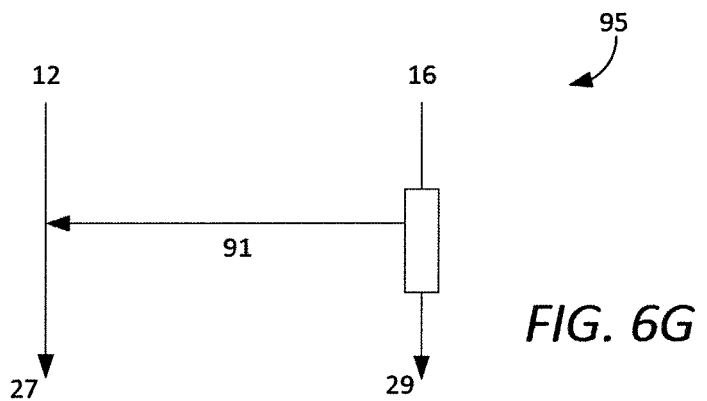
FIG. 6G is a schematic diagram of a spontaneous exception according to an embodiment of the invention.
Figure 6H:
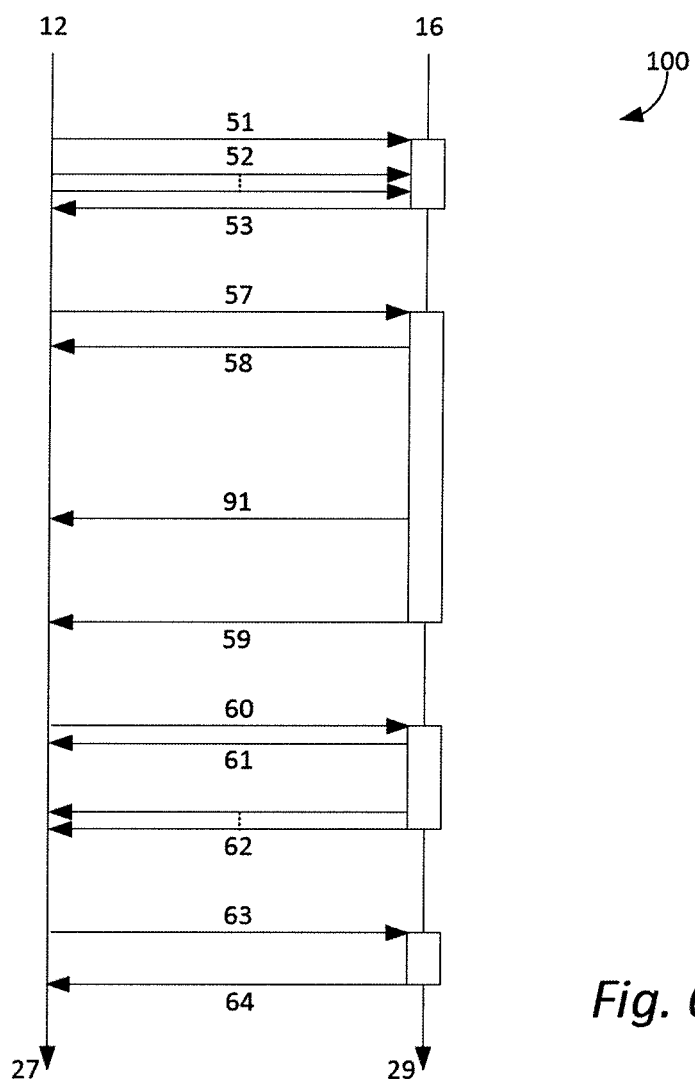
FIG. 6H is a schematic diagram of an exception during execute command according to an embodiment of the invention.

FIGS. 6F, 6G, and 6H show three cases for an exception sequence 90. Exception messages are sent to SUSC 12 by a subsystem 16 when an exception 90 occurs in the form of, for example, an error or an alarm. An error is used to communicate to the user 4 that the lithographic element is not behaving as expected. An alarm is a condition that must be acknowledged by the user 4.

Exceptions 91 that occur within the context of executing an interface command may be tagged with context information. For exceptions 91 that occur outside the context of such command (spontaneous exceptions 90) these context fields may be left empty or the most appropriate context of an already completed command that is related to the failure may be supplied.

Especially in the case of spontaneous exceptions 90 care should be taken not to flood the user 4 with exceptions. For example, if an error condition is detected in a high frequency control loop, ideally only one exception 91 should be logged by a data network hub 14 for that condition and not repeatedly for every iteration of the loop. It would also be better to repeat the exception 91 at a low (preferably 1 minute) frequency if the condition persists, or log a follow-up exception 91 when the condition changes or disappears (which is also unexpected so that can still be considered an exception 91).

Exceptions 91 are intended to notify the operator 4 of error situations, to guide the operator 4 through a recovery procedure and to communicate the essence of a problem in a concise manner, for example by telephone or trouble ticket title. Exceptions 91 should therefore not be considered as a debugging information channel for module designers. Alternatively, PJ outputs in human readable data formats may be used for information that could be monitored or investigated offline.

Exception messages 91 do not terminate protocol sequences and are no reason to stop handling future commands. For example, after a interface command fails and an exception 91 is logged by a data network hub 14, executeDone 59 may still be sent and outputs made available to 'get'. The subsystem 16 should also be ready to accept new interface commands to recover from the situation.

An exception 91 is allowed to be inserted at any time in the protocol, except within the getReply 61 sequence. If any exceptions 91 can be generated by a parallel thread the PIC 16 designer could consider to allocate a dedicated PIC 16 connection for logging such exceptions 91 and not for any commands. That avoids this interference in a straightforward manner.

FIG. 6F shows an exception 91 generated by the subsystem 16 during a generic or any protocol command 92 sent from SUSC 12. After the exception 91, the subsystem 16 also sends an any protocol command reply 93 to SUSC 12. FIG. 6G shows a spontaneous exception 91 and FIG. 6H shows an exception 91 sent from the subsystem 16 to SUSC 12 during an execute command 57. During any protocol command 92 an exception 91 can be raised. The command is terminated normally with the associated reply message. It is also possible that between commands from SUSC 12 an exception 91 is logged, as shown in FIG. 6G. For example from a periodic check or from a hub initialization sequence. When an exception 91 is sent during an execute command 57, the get 60 and delete 63 commands are executed as though no exception 91 has occurred. However, it is possible that due to the occurrence of the exception 91 some output arguments may be empty (0 bytes).

Data Network

The subsystems 16 are connected via data network 140 to data network hub 14. Data collection, storage and management is performed via the data network 140. The control network 120 forms a control network path between the element control unit 12 and the lithography subsystems 16, and the data network 140 forms a data network path between the data network hub 14 and the lithography subsystems 16. The control network 120 and data network 140 are physically separate networks, Each network has its own separate physical media, including wiring, network components such as switches, and network connections to the subsystems 16. Thus the control network path and the data network path comprise physically separate media and form separate and independent communication paths.

Each lithography subsystem 16 has a connection to the control network 140 adapted to receive and transmit control information from and to the element control unit 12 via the control network. Each lithography subsystem 16 has a separate connection to the data network 140, adapted to transmit data information to the data network hub 14 via the data network.

The data network 140 is designed with a bandwidth much greater than the transmission rates used by the subsystems 16. For example, the data network 140 may have a bandwidth of 1 Gbit/s and the subsystems designed to transmit at 100 Mbit/s. In the data network there is no network controller or coordination of data transfers. Typically in the data network 140, a data exchange cap is set at 140 Mbit between the subsystems 16 and the data network 140, whereas a cap of 1 Gbit is set on a data exchange between the data network 140 and SUSD 14. A network switch is included in the data network 140 to merge traffic, to prevent (data) package collision.

The data network hub 14 is adapted to continuously log data received from the subsystems 16. This data may include measurement data taken by the subsystems during a execution of a PJ, settings of the subsystems, and data for debugging and fault tracing. The data network hub 14 preferably is always logging all data, including low-level tracing data, so there is no need to turn on data logging. This continual data logging speeds up problem diagnosis, reducing the need to rerun and reproduce an error or problem.

The element control unit 12 is connected to the data network hub 14 to send information relating to the progress of PJs executing in the element control unit 12 for logging by the data network hub 14. The data network hub 14 continuously logs the data received from the element control unit 12.

Data network hub 14 includes very large data storage capacity, sufficient for storage of very large quantities of low level data from all subsystems 16 over a long operating time period, e.g. in the order of months or years. The data stored by data network hub 14 is organized and tagged, preferably with a time stamp and PJ identifier. The stored data can be retrieved from the data network hub 14 and analyzed and filtered, preferably off-line.

Separation of data collection via the data network 140 from control communications via the control network 120, enables high frequency collection of high volume data across the data network without compromising communications across the control network. The control network is enabled to operate in quasi real-time by controlling congestion on the control network 120, and avoiding the high volume traffic present on the data network 140. Separation of data management and storage functions in the data network hub 14 and PJ execution in the element control unit 12, enables processing of high volumes of data by the data network hub 14 without compromising the processing of PJs by the element control unit 12. The separation of control and data collection and management enables a simpler design without needing to account for interaction between the two systems.

The invention has been described by reference to certain embodiments discussed above. It will be recognized that these embodiments are susceptible to various modifications and alternative forms well known to those of skill in the art without departing from the spirit and scope of the invention. Accordingly, although specific embodiments have been described, these are examples only and are not limiting upon the scope of the invention, which is defined in the accompanying claims.

The invention claimed is:

1. A lithography system comprising one or more lithography elements, each lithography element arranged for independent exposure of substrates according to pattern data, and each lithography element comprising a plurality of lithography subsystems, the lithography system further comprising:
   a control network forming a control network path between the plurality of the lithography subsystems and at least one element control unit for communication of control information;
   wherein the lithography system is arranged for:
   issuing control information to the at least one element control unit to control operation of one or more of the lithography subsystems for exposure of one or more wafers;
   issuing a process program to the element control unit, the process program comprising a set of predefined commands and associated parameters, each command corresponding to a predefined action or sequence of actions to be performed by one or more of the lithography subsystems, and the parameters further defining how the action or sequence of actions are to be performed,
   wherein the element control unit is arranged to transmit a command of the process program to a lithography subsystem to be executed by the lithography subsystem, regardless of an execution status of a preceding command transmitted to the lithography subsystem, and wherein the element control unit is configured to transmit a sequence of repeated commands to the lithography subsystem, wherein the lithography subsystem discards a command in the sequence, if the command in the sequence is not executed within a time period.

2. System according to claim 1, wherein the set of predefined commands in the process program comprises updating or upgrading software in one or more of the lithography subsystems.

3. System according to claim 1, wherein the element control unit is arranged for scheduling the process program to generate a corresponding process job for execution by one or more of the lithography subsystems.

4. System according to claim 3, wherein a modification of software in a lithography subsystem to update or upgrade the software is performed by executing a process job.

5. System according to claim 1, wherein a plurality of the lithography subsystems are configured to boot from a central disk or memory, such that a modification of software in a lithography subsystem is performed by updating a boot image for the lithography subsystem in the central disk or memory.

6. System according to claim 1, wherein an extension or upgrade of the lithography system with new functionality is performed by a modification of software in one or more of the lithography subsystems and by issuing an updated process program.

7. System of claim 6, wherein one or more of the lithography subsystems are configured to transmit information of executable commands to the element control unit after a modification of software in the one or more of the lithography subsystems.

8. System of claim 6, wherein the extension or upgrade of the lithography system does not require a modification of software in the element control unit.

9. System of claim 1, further comprising a data network for collecting, storing and managing data, including setting of a plurality of the lithography subsystems, wherein the lithography subsystems are connected via the data network to a data network hub.

10. System of claim 9, wherein the control network and the data network form separate networks.

11. System of claim 9, wherein a plurality of the lithography subsystems are configured to boot from the data network hub, such that a modification of software in a lithography subsystem is performed by updating a boot image for the lithography subsystem on the data network hub.

12. System of claim 9, wherein the data stored by the data network hub is tagged with a timestamp.

13. System of claim 9, further comprising a pattern data processing system for generating the pattern data, wherein the data processing system is arranged to transmit the pattern data to one or more of the lithography subsystems via a data path separate from the control network and the data network.

14. System according to claim 1, wherein the process program defines a first predetermined time period for a corresponding first command, and wherein the element control unit is arranged to delay initiating a next command following the first command until expiration of the time period and regardless of an execution status of the first command.

15. System according to claim 1, wherein the control network provides quasi real-time performance without using a real-time communication protocol.

16. A lithography system comprising one or more lithography elements, each lithography element arranged for independent exposure of substrates according to pattern data, and each lithography element comprising a plurality of lithography subsystems, the lithography system further comprising:

a control network forming a control network path between the plurality of the lithography subsystems and at least one element control unit for communication of control information; and a data network hub connected to the lithography subsystems;

wherein the lithography system is arranged for:

issuing control information to the at least one element control unit to control operation of one or more of the lithography subsystems for exposure of one or more wafers;

issuing a process program to the element control unit, the process program comprising a set of predefined commands and associated parameters, each command corresponding to a predefined action or sequence of actions to be performed by one or more of the lithography subsystems, and the parameters further defining how the action or sequence of actions are to be performed, wherein the element control unit is arranged to transmit a command of the process program to a lithography subsystem to be executed by the lithography subsystem, regardless of an execution status of a preceding command transmitted to the lithography subsystem, and wherein a plurality of the lithography subsystems are configured to boot from the data network hub, such that a modification of software in a lithography subsystem is performed by updating a boot image for the lithography subsystem on the data network hub.

17. System according to claim 16, wherein the set of predefined commands in the process program comprises updating or upgrading software in one or more of the lithography subsystems.

18. System according to claim 16, wherein an extension or upgrade of the lithography system with new functionality is performed by a modification of software in one or more of the lithography subsystems and by issuing an updated process program.

19. System of claim 16, wherein one or more of the lithography subsystems are configured to transmit information of executable commands to the element control unit after a modification of software in the one or more of the lithography subsystems.

20. System of claim 16, wherein the extension or upgrade of the lithography system does not require a modification of software in the element control unit.

21. System of claim 16, further comprising a data network for collecting, storing and managing data, including setting of a plurality of the lithography subsystems, wherein the lithography subsystems are connected via the data network to the data network hub.

22. System of claim 21, wherein the control network and the data network form separate networks.

* * * * *